(12) United States Patent
Robins et al.

(10) Patent No.: US 7,554,130 B1
(45) Date of Patent: Jun. 30, 2009

(54) REDUCING EFFECTS OF PARASITIC TRANSISTORS IN THYRISTOR-BASED MEMORY USING AN ISOLATION OR DAMAGE REGION

(75) Inventors: Scott Robins, San Jose, CA (US); Kevin J. Yang, Santa Clara, CA (US); Rajesh N. Gupta, Mountain View, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 193 days.

(21) Appl. No.: 11/361,869

(22) Filed: Feb. 23, 2006

(51) Int. Cl.
*H01L 29/74* (2006.01)
(52) U.S. Cl. ....................... 257/107; 257/115
(58) Field of Classification Search ........... 257/107, 257/115, 155
See application file for complete search history.

(56) References Cited

U.S. PATENT DOCUMENTS

| | | | |
|---|---|---|---|
| 6,462,359 B1 | 10/2002 | Nemati et al. |
| 6,583,452 B1 | 6/2003 | Cho et al. |
| 6,611,452 B1 | 8/2003 | Han |
| 6,653,174 B1 | 11/2003 | Cho et al. |
| 6,653,175 B1 | 11/2003 | Nemati et al. |
| 6,666,481 B1 | 12/2003 | Horch et al. |
| 6,683,330 B1 | 1/2004 | Horch et al. |
| 6,686,612 B1 | 2/2004 | Horch et al. |
| 6,690,038 B1 | 2/2004 | Cho et al. |
| 6,690,039 B1 | 2/2004 | Nemati et al. |
| 6,703,646 B1 | 3/2004 | Nemati et al. |
| 6,721,220 B2 | 4/2004 | Yoon et al. |
| 6,727,528 B1 | 4/2004 | Robins et al. |
| 6,734,815 B1 | 5/2004 | Abdollahi-Alibeik et al. |
| 6,735,113 B2 | 5/2004 | Yoon et al. |
| 6,756,612 B1 | 6/2004 | Nemati et al. |
| 6,756,838 B1 | 6/2004 | Wu et al. |
| 6,767,770 B1 | 7/2004 | Horch et al. |
| 6,777,271 B1 | 8/2004 | Robins et al. |
| 6,778,435 B1 | 8/2004 | Han et al. |
| 6,781,888 B1 | 8/2004 | Horch et al. |
| 6,785,169 B1 | 8/2004 | Nemati et al. |
| 6,790,713 B1 | 9/2004 | Horch |
| 6,804,162 B1 | 10/2004 | Eldridge et al. |
| 6,815,734 B1 | 11/2004 | Horch et al. |
| 6,818,482 B1 | 11/2004 | Horch et al. |
| 6,819,278 B1 | 11/2004 | Abdollahi-Alibeik et al. |
| 6,828,176 B1 | 12/2004 | Nemati et al. |
| 6,828,202 B1 | 12/2004 | Horch |
| 6,835,997 B1 | 12/2004 | Horch et al. |

(Continued)

Primary Examiner—Phat X Cao
(74) Attorney, Agent, or Firm—The Webostad Firm

(57) ABSTRACT

An integrated circuit having memory, including thyristor-based memory cells, is described, where each of the thyristor-based memory cells includes a thyristor-based storage element and an access transistor. Where the thyristor-based storage element includes an anode region and a cathode region, a pair of the thyristor-based memory cells are commonly coupled via a bitline associated with the access transistor or via a reference voltage line coupled to the anode region. Bitline or anode regions are separated from one another by an isolation region. In another configuration, a bitline region has a locally implant-damaged region to inhibit charge transfer between the pair. In yet another configuration, a storage node contact or contacts respectively can extend over or are coupled to a storage node line extending over an isolation region. In this latter configuration, a source/drain region and the cathode region are separated from one another by an isolation region.

5 Claims, 14 Drawing Sheets

U.S. PATENT DOCUMENTS

| | | |
|---|---|---|
| 6,845,037 B1 | 1/2005 | Han |
| 6,872,602 B1 | 3/2005 | Nemati et al. |
| 6,885,581 B2 | 4/2005 | Nemati et al. |
| 6,888,176 B1 | 5/2005 | Horch et al. |
| 6,888,177 B1 | 5/2005 | Nemati et al. |
| 6,891,205 B1 | 5/2005 | Cho et al. |
| 6,891,774 B1 | 5/2005 | Abdollahi-Alibeik et al. |
| 6,901,021 B1 | 5/2005 | Horch et al. |
| 6,903,987 B2 | 6/2005 | Yoon et al. |
| 6,911,680 B1 | 6/2005 | Horch et al. |
| 6,913,955 B1 | 7/2005 | Horch et al. |
| 6,937,085 B1 | 8/2005 | Samaddar |
| 6,940,772 B1 | 9/2005 | Horch et al. |
| 6,944,051 B1 | 9/2005 | Lee et al. |
| 6,947,349 B1 | 9/2005 | Abdollahi-Alibeik et al. |
| 6,953,953 B1 | 10/2005 | Horch |
| 6,958,931 B1 | 10/2005 | Yoon et al. |
| 6,965,129 B1 | 11/2005 | Horch et al. |
| 6,975,260 B1 | 12/2005 | Abdollahi-Alibeik et al. |
| 6,979,602 B1 | 12/2005 | Horch et al. |
| 6,980,457 B1 | 12/2005 | Horch et al. |
| 6,998,298 B1 | 2/2006 | Horch |
| 6,998,652 B1 | 2/2006 | Horch et al. |
| 7,006,398 B1 | 2/2006 | Yoon et al. |
| 7,015,077 B1 | 3/2006 | Horch et al. |
| 7,037,763 B1 | 5/2006 | Nemati et al. |
| 7,042,759 B2 | 5/2006 | Nemati et al. |
| 2005/0233506 A1* | 10/2005 | Horch et al. .......... 438/134 |

* cited by examiner

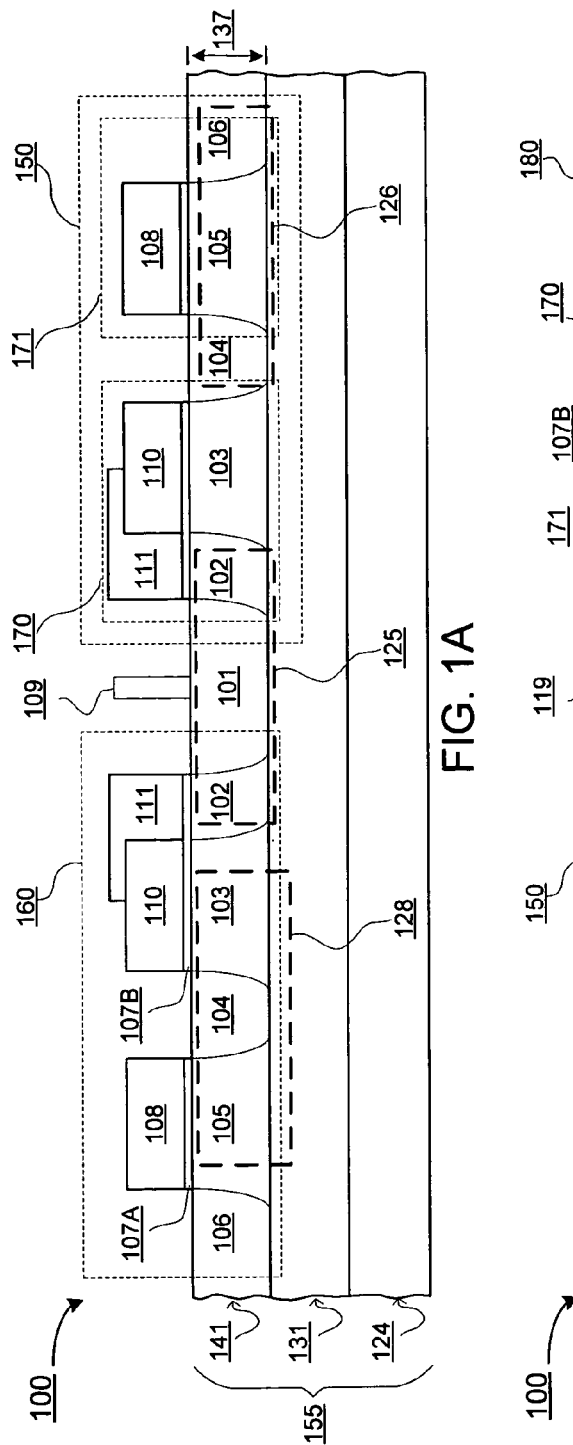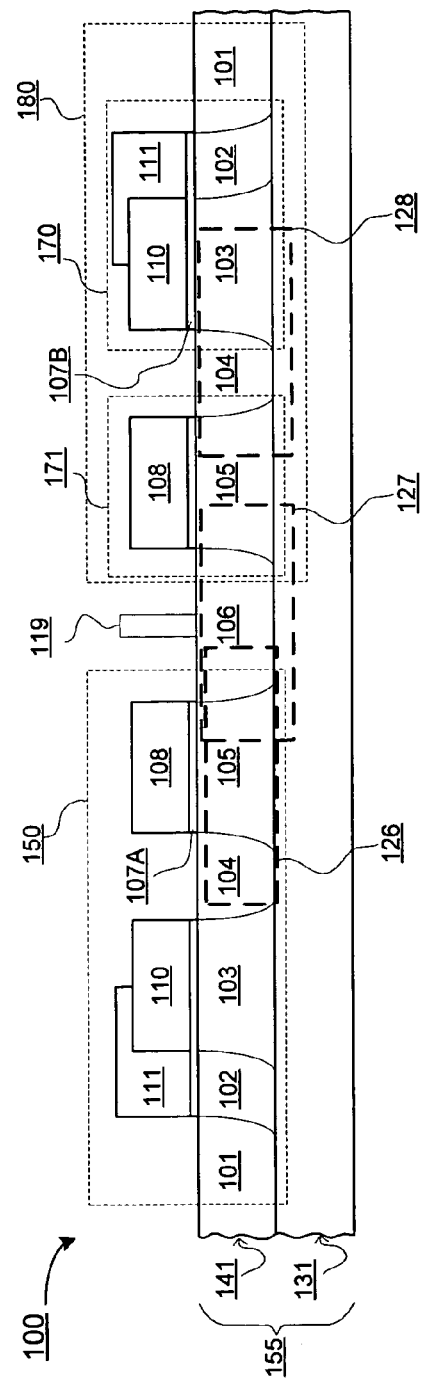
FIG. 1A
FIG. 1B

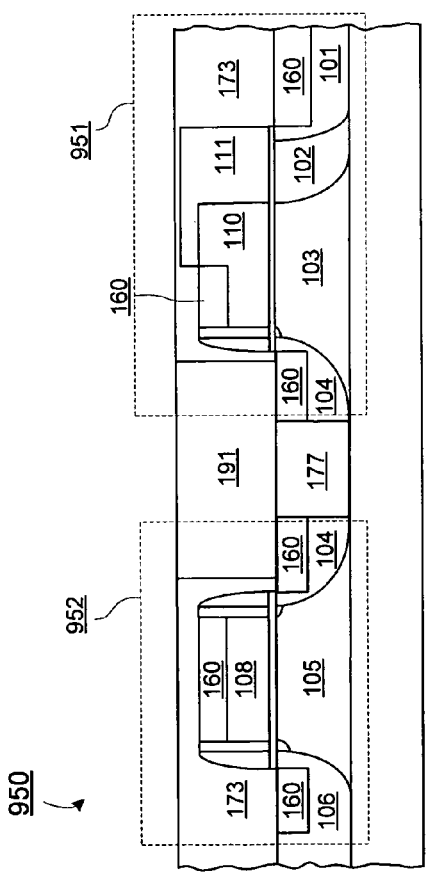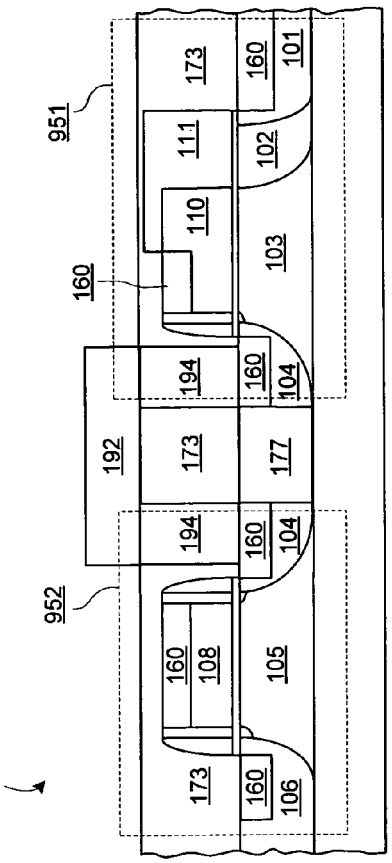

US 7,554,130 B1

REDUCING EFFECTS OF PARASITIC TRANSISTORS IN THYRISTOR-BASED MEMORY USING AN ISOLATION OR DAMAGE REGION

FIELD OF THE INVENTION

One or more aspects of the present disclosure relate generally to semiconductor devices and, more particularly, to integrated circuits with thyristor-based memory cells.

BACKGROUND OF THE INVENTION

Conventionally, semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow, having an access time commonly near 20 nanoseconds ("ns"). Though SRAM access time is typically an order of magnitude faster than DRAM, an SRAM cell is commonly made of four transistors and two resistors or of six transistors, leading to a cell size of approximately $60F^2$ to $100F^2$.

SRAM memory designs based on a negative differential resistance cell, such as a thyristor-based memory cell, have been introduced to minimize the size of a conventional SRAM memory. A thyristor-based memory may be effective in stand-alone and embedded memory applications. Examples of thyristor-based memory cells are described in additional detail in U.S. Pat. Nos. 6,767,770 B1, 6,686,612 B1, 6,690,039 B1, 6,815,734 B1, and 6,818,482 B1.

Unfortunately, parasitic transistors, whether existing internally to a thyristor-based memory cell ("intra-cell parasitic transistors") or created by thyristor-based memory cells connected together in an array ("inter-cell parasitic transistors") may negatively impact performance. For example, an inter-cell parasitic transistor may facilitate charge to be transferred from one thyristor-based memory cell to another commonly coupled thereto. Charge from one thyristor-based memory cell injected into an adjacent thyristor-based memory cell may make the adjacent memory cell less stable or may make both memory cells less stable. Moreover, an intra-cell parasitic transistor may undesirably impact stability or operability of a thyristor-based memory cell by facilitating unwanted charge transport within such cell.

Accordingly, it would be desirable and useful to provide means to reduce one or more effects of parasitic transistors associated with one or more thyristor-based memory cells of a thyristor-based memory array.

SUMMARY OF THE INVENTION

An aspect of the invention is an integrated circuit having memory, including thyristor-based memory cells, where each of the thyristor-based memory cells includes a thyristor-based storage element and an access transistor. The thyristor-based storage element includes an anode region and a cathode region. A pair of the thyristor-based memory cells are commonly coupled via a bitline coupled to the access transistor of each thyristor-based memory cell of the pair. The bitline is coupled to respective bitline regions of the pair of the thyristor-based memory cells, where the bitline regions are separated from one another by an isolation region. The isolation region eliminates a parasitic bipolar junction transistor formed by commonly coupling the pair of the thyristor-based memory cells to a common bitline region, as the common bitline region is divided into the bitline regions responsive to formation of the isolation region.

Another aspect of the invention is an integrated circuit having memory, including: thyristor-based memory cells, where each of the thyristor-based memory cells includes a thyristor-based storage element and an access transistor. The thyristor-based storage element includes an anode region and a cathode region. A pair of the thyristor-based memory cells are commonly coupled via a reference voltage line coupled to the anode region of each thyristor-based memory cell of the pair. The reference voltage line is coupled to respective anode regions of the pair of the thyristor-based memory cells, where the anode regions are separated from one another by an isolation region. The isolation region eliminates a parasitic bipolar junction transistor formed by commonly coupling the pair of the thyristor-based memory cells to a common anode region, where the common anode region is divided into the anode regions responsive to formation of the isolation region.

Yet another aspect of the invention is an integrated circuit having memory, including: thyristor-based memory cells, where each of the thyristor-based memory cells includes a thyristor-based storage element and an access transistor. The thyristor-based storage element has a cathode region coupled to a source/drain region of the access transistor via separate storage node contacts. The storage node contacts are coupled to a storage node line extending over an isolation region. The source/drain region and the cathode region are separated from one another by the isolation region. The isolation region eliminates a parasitic bipolar junction transistor formed by the source/drain region and the cathode region having a common well, where the common well is divided into the source/drain region and the cathode region responsive to formation of the isolation region.

Still yet another aspect of the invention is an integrated circuit having memory, including: thyristor-based memory cells, where each of the thyristor-based memory cells includes a thyristor-based storage element and an access transistor. The thyristor-based storage element has a cathode region coupled to a source/drain region of the access transistor via a storage node contact. The storage node contact extends over an isolation region. The source/drain region and the cathode region are separated from one another by the isolation region. The isolation region eliminates a parasitic bipolar junction transistor formed by the source/drain region and the cathode region having a common well, where the common well is divided into the source/drain region and the cathode region responsive to formation of the isolation region.

Further, yet another aspect of the invention is an integrated circuit having memory, including: thyristor-based memory cells, where each of the thyristor-based memory cells includes a thyristor-based storage element and an access transistor. The thyristor-based storage element includes an anode region and a cathode region. A pair of the thyristor-based memory cells are commonly coupled via a bitline region associated with the access transistor. The pair of the thyristor-based memory cells define a parasitic bipolar junction transistor therebetween responsive to the bitline region being common. The bitline region has a locally implant-damaged region to inhibit charge transfer between the pair of the thyristor-based memory cells via the parasitic bipolar junction transistor.

BRIEF DESCRIPTION OF THE DRAWINGS

Accompanying drawings(s) show exemplary embodiment(s) in accordance with one or more aspects of the invention; however, the accompanying drawing(s) should not be taken to limit the invention to the embodiment(s) shown, but are for explanation and understanding only.

FIG. 1A is a cross-sectional view depicting an exemplary embodiment of a thyristor-based memory cell array ("memory array").

FIG. 1B is a cross-sectional view depicting an exemplary embodiment of a memory array having two memory cells commonly coupled via a bitline region.

FIG. 7E is cross-sectional view depicting an exemplary embodiment of a thyristor-based memory cell ("memory cell") with separate storage node regions on either side of an STI region.

FIG. 7F is a cross-sectional view depicting an exemplary embodiment of a memory cell with a pair of storage node contacts on either side of an STI region.

DETAILED DESCRIPTION OF THE DRAWINGS

Figure 2A:
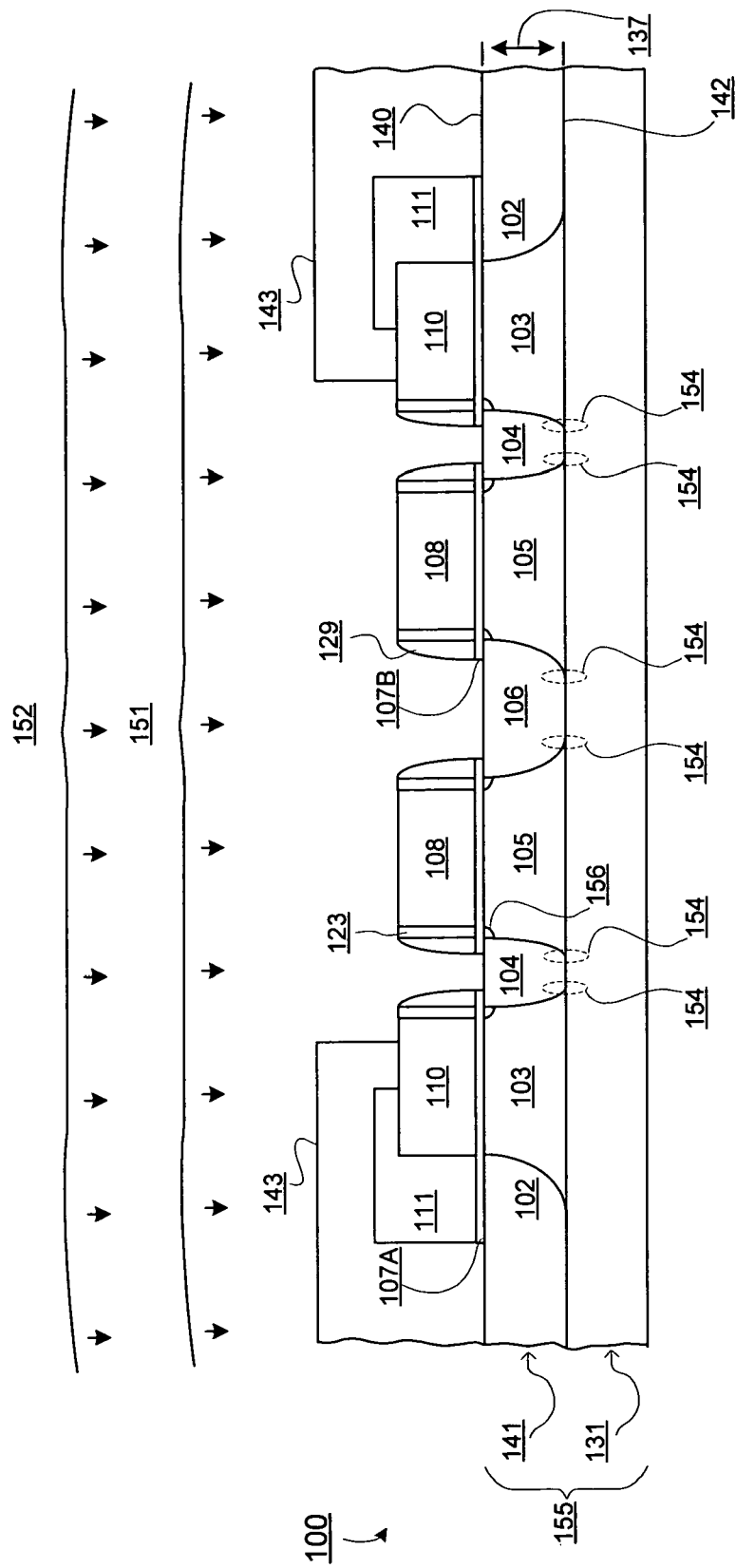
FIG. 2A is a cross-sectional view depicting an exemplary embodiment of a deep n+ region implant for a memory array.

One or more aspects of the invention may be applicable to a variety of different types of semiconductor devices, and may be particularly suited for silicon-on-insulator ("SOI") devices, such as thyristor-based memory devices, and for enhancing the ability to form such devices. While the present disclosure is not necessarily limited to such devices, various aspects of the invention may be appreciated through a description of various examples using this context.

FIG. 1A is a cross-sectional view depicting an exemplary embodiment of a thyristor-based memory cell array ("memory array") 100. Memory array 100 may be formed on a semiconductor wafer 155. In this example, semiconductor wafer 155 is an SOI wafer, as some parasitic transistors described elsewhere herein are associated with use of SOI wafers. However, it should be appreciated that memory array 100 may be formed on a bulk semiconductor wafer, such as a bulk silicon wafer, and thus those parasitic transistors generally associated with SOI wafers may be avoided. Moreover, it should be understood that semiconductors other than silicon may be used.

SOI wafer 155 includes a substrate 124 on which a buried oxide ("BOx") layer 131 is formed. Substrate 124 is omitted in subsequent figures herein to avoid unnecessary detail. Over BOx layer 131 is formed silicon layer 141. Silicon layer 141 may have n-type or p-type dopants. In the example described herein, silicon layer 141 is a p-type layer, although an n-type layer may be used. More particularly, in the example described herein, silicon layer 141 is has a p− dopant concentration, though other doping concentrations may be used.

In the cross-sectional view of FIG. 1A, thyristor-based memory cells ("memory cells") 150 and 160, generally indicated by associated dashed boxes, are illustratively shown as having a common reference voltage line contact 109. Notably, formation of some spacers, silicides, and other known details regarding memory cells 150 and 160 are omitted for purposes of clarity.

Reference voltage line contact 109 may be for coupling memory cells 150 and 160 to a reference voltage source. Reference voltage line contact 109 is coupled to anodic region 101, which is common to both of memory cells 150 and 160. Region 101 is referred to as an "anodic" region or anode herein, as current is sourced via region 101 for a memory cell, such as memory cell 150 for example. In this example, anode 101 is a p-type region having a p+ dopant concentration formed in silicon layer 141. As memory cells 150 and 160 are similarly constructed, only one is described in detail herein to avoid unnecessary repetition.

Memory cell 150 includes a thyristor-based storage element ("storage element") 170. Storage element 170 is coupled to an access device, such as a field effect transistor ("access transistor") 171. Storage element 170 may be coupled to access transistor 171 at a common region, namely, region 104. Region 104 is referred to as a "cathodic" region or cathode, as current passing through storage element 170 may be output via cathode 104. In this embodiment, cathode 104 may be an n-type region having an n+ dopant concentration formed in silicon layer 141. Cathode 104 may be referred to as a source/drain node of access transistor 171.

Storage element 170 includes base regions 102 and 103. In this example, base region 102 is an n-type base region ("n-base") 102, and base region 103 is a p-type base region ("p-base") 103.

In addition to source/drain region 104, access transistor 171 includes source/drain region 106 and transistor body region 105. In this exemplary embodiment, source/drain region 106 is an n-type region having an n+ dopant concentration formed in silicon layer 141, and transistor body region 105 is a p-type region having a p dopant concentration formed in silicon layer 141. Accordingly, transistor body region 105 may be referred to herein as p-well 105. Source/drain region 106 may be coupled to a bitline, as described elsewhere herein, of memory array 100, and accordingly may be referred to herein as bitline region 106.

One or more dielectric layers may be formed over a top surface of silicon layer 141 to provide gate dielectrics 107A and 107B. Notably, gate dielectrics 107A and 107B may be the same or different. Formed over gate dielectric 107B and generally above n-base 102 and partially over gate 110 is a dielectric offset spacer 111.

Formed above gate dielectrics 107A and 107B are wordlines. For memory array 100, included are two types of wordlines, namely WL2s for directly accessing storage elements 170 thereof and WL1s for directly accessing access transistors 171 thereof. WL1s are formed over gate dielectric 107A and WL2s are formed over gate dielectric 107B. At locations along such WL1s and WL2s, below which are p-wells 105 and p-bases 103, respectively, defined gates are formed above gate dielectrics 107A and 107B, respective. Thus, continuing the example of memory cell 150, disposed above gate dielectric 107A in access transistor 171 is a gate 108 formed of a portion of a WL1, and disposed above gate dielectric 107B in storage element 170 is a gate 110 formed of a portion of a WL2. Gate 108 is referred to herein as an access gate as it is associated with an access device, such as access transistor 171, for accessing a memory cell, and gate 110 is referred to herein as a control gate as it is associated with controlled access to a storage element 170 for writing a logic 1 or a logic 0 to a memory cell.

Because memory cells 150 and 160 share reference line contact 109 and thus anode 101, a parasitic bipolar junction transistor ("BJT") 125 is formed, as is illustratively shown in FIG. 1A by heavy dashed lines. Parasitic BJT 125 is formed of n-base 102 of memory cell 160, anode 101 common to both memory cells 150 and 160, and n-base 102 of memory cell 150. Accordingly, parasitic BJT 125 is an inter-cell parasitic transistor. Transport of charge from one memory cell to another, such as from memory cell 150 to memory cell 160, is undesirably facilitated by parasitic BJT 125. Thus, data state in one memory cell, such as memory cell 150 or 160, may be influenced by data state in the other memory cell, such as memory cell 160 or 150. Accordingly, charge may be transferred in either direction via BJT 125 as between common anode memory cells.

As is known with respect to formation of field effect transistors ("FETs") using SOI wafers, each FET may include a co-existing BJT. So, for each access transistor 171 being an FET, there is a corresponding, co-existing parasitic BJT 126. BJT 126 is formed of source/drain 104, p-well 105, and bitline region 106 of access transistor 171.

Having parasitic BJT 126 in parallel with access transistor 171 may cause charge to be injected from memory cell 150 to a neighboring memory cell commonly coupled via bitline region 106, as illustratively shown in the cross-sectional view depicted in FIG. 1B.

FIG. 1B is a cross-sectional view depicting an exemplary embodiment of memory array 100 having memory cells 150 and 180 commonly coupled via bitline region 106. A common bitline contact 119 is coupled to bitline region 106. Memory cell 180 is formed as previously described with reference to memory cell 150, and thus such description is not repeated.

In the example of FIG. 1B, parasitic BJT 126 may undesirably facilitate injection of charge from memory cell 150 into p-well 105 of memory cell 180 via common bitline region 106. This injected charge may undesirably go into or through cathode 104 of memory cell 180. Accordingly, such injection of charge may undesirably impact data stored in a common bitline-neighboring memory cell. Furthermore, parasitic BJT 126 may undesirably facilitate injection of holes into p-well 105 of access device 171. Injection of holes into a p-well 105 of a bitline-neighboring memory cell or of a memory cell in which such parasitic BJT 126 is located may increase sub-threshold voltage leakage current of NMOS access transistor 171. This increase in sub-threshold voltage leakage may undesirably impact data stored in a bitline-neighboring memory cell, such as memory cell 180 with respect to memory cell 150 for example, or the memory cell in which such parasitic BJT 126 is located, such as memory cell 150 for example.

Furthermore, by sharing a common bitline region 106, memory cells 150 and 180 form a parasitic BJT 127. Parasitic BJT 127 is formed of p-wells 105 of adjacent access transistors 171 and common bitline region 106. BJT 127 may undesirably facilitate charge transport from one memory cell to another memory cell coupled to the same bitline. For example, data state in memory cell 150 may be undesirably influenced by data state in memory cell 180 owing to charge transport facilitated via parasitic BJT 127.

With simultaneous reference to FIGS. 1A and 1B, another parasitic BJT 128 is described. Parasitic BJT 128 results from a thyristor-based memory cell, such as any of memory cells 150, 160, and 180, with an access transistor 171 coupled to a storage element 170 via a common cathode 104. Parasitic BJT 128 is formed of p-well 105, common cathode 104, and p-base region 103 of a memory cell. Parasitic BJT 128 may undesirably facilitate charge transport from p-base region 103 through cathode 104 to p-well 105 of access transistor 171, which may undesirably impact a data state stored in the memory cell associated with such parasitic BJT 128. In other words, parasitic BJT 128 may undesirably facilitate charge leakage from the memory cell in which such parasitic BJT 128 is located. Furthermore, charge may be injected in the opposite direction, i.e., into the memory cell, as undesirably facilitated by the parasitic BJT 128 located therein. For example, charge injected from common bitline region 106 into p-well 105 may be further injected as facilitated by parasitic BJT 128 into p− base region 103. Such injection of charge may undesirably impact a stored data state in the memory cell in which BJT 128 is located. A junction between region 105 and 106 may be forward biased, and thus electrons may be injected into region 106. These electrons may thus be injected into the memory cell through bipolar transistor 128.

For purposes of clarity, parasitic BJTs 125, 126, 127, and 128 may be respectively referred to herein as anode BJT 125, FET BJT 126, bitline BJT 127, and storage node BJT 128. It should be understood that anode BJT 125 and bitline BJT 127 are inter-cell parasitic BJTs, owing to a common contact region as between memory cells. FET BJT 126 and storage node BJT 128 are formed in a thyristor-based memory cell, such as memory cell 150, and as such are referred to as intra-cell parasitic BJTs.

For purposes of clarity, it shall be assumed that memory cells 150, 160, and 180 are formed in part as described below with known processing steps being omitted for purposes of clarity. Moreover, it should be understood that processing as described below may be implemented in whole or in part, and some embodiments are alternatives of other embodiments. Thus, memory cells 150, 160, and 180 may be formed with one or more of the processing technologies described below to reduce or eliminate unwanted affects of one or more parasitic BJTs 125, 126, 127, and 128.

It should be understood that collector current, namely injected current, for a BJT is proportional to the inverse of the amount of dopants present. In other words, the dominant current path is the more lightly doped portion. Thus, by increasing the amount of dopants in a region, or targeted portion thereof, such injected current may be reduced.

In FIG. 2A, there is shown a cross-sectional view depicting an exemplary embodiment of a deep n+ region implant for memory array 100. As illustratively shown, p-wells 105, gate dielectrics 107A and 107B, offset spacers 111, gates 110, gates 108, extension regions 156, "zero" spacers 123, and sidewall spacers 129 have been already been formed as is known. Notably, only one bitline region 106 is illustratively shown in FIG. 2A, as only a portion of memory array 100 is shown for purposes of clarity. However, though reference to a bitline region 106 is made, it should be understood to include multiple bitline regions. Regions 102, 104, and 106 are formed responsive to implants into silicon layer 141 extending from top surface 140 to bottom surface 142 of silicon layer 141.

In the example of FIG. 2A, a mask 143 is used to mask off n-base regions 102, leaving top surface 140 of silicon layer 141 exposed with respect to location of cathodes 104 and bitline region 106. Implant 152 may follow immediately after implant 151. One of implants 151 and 152 is to provide a deeper implant than the other. For purposes of clarity by way of example and not limitation, it shall be assumed that implant 152 is a deeper implant than implant 151. Implants 151 and 152 may each be of an n-type material to create at least initially an n concentration in regions 104 and 106. Implant 151 is used to at least initially form n-base cathodes 104 and bitline region 106. Implant 152 is used in regions 104 and 106 to increase dopant concentration at least proximate to bottom surface 142 of silicon layer 141, such as generally at locations 154 for example.

Alternatively, an n+ concentration implant 151 may be provided to memory array 100. Implant 151 may be followed implant 152, again where one of implants 151 and 152 is deeper than the other. For purposes of clarity by way of example and not limitation, it shall be assumed that implant 152 is deeper than implant 151. Implants 151 and 152 provide regions 104 and 106 with an n+ concentration. Thus, it should be appreciated that n-base regions 102, which are masked for implants 151 and 152, may be formed with an n concentration and bitline region 106 and cathodes 104 may have an n+ concentration for this exemplary embodiment. Notably, anode regions 101 of FIGS. 1A and 1B may be subsequently formed as is known.

Figure 2B:
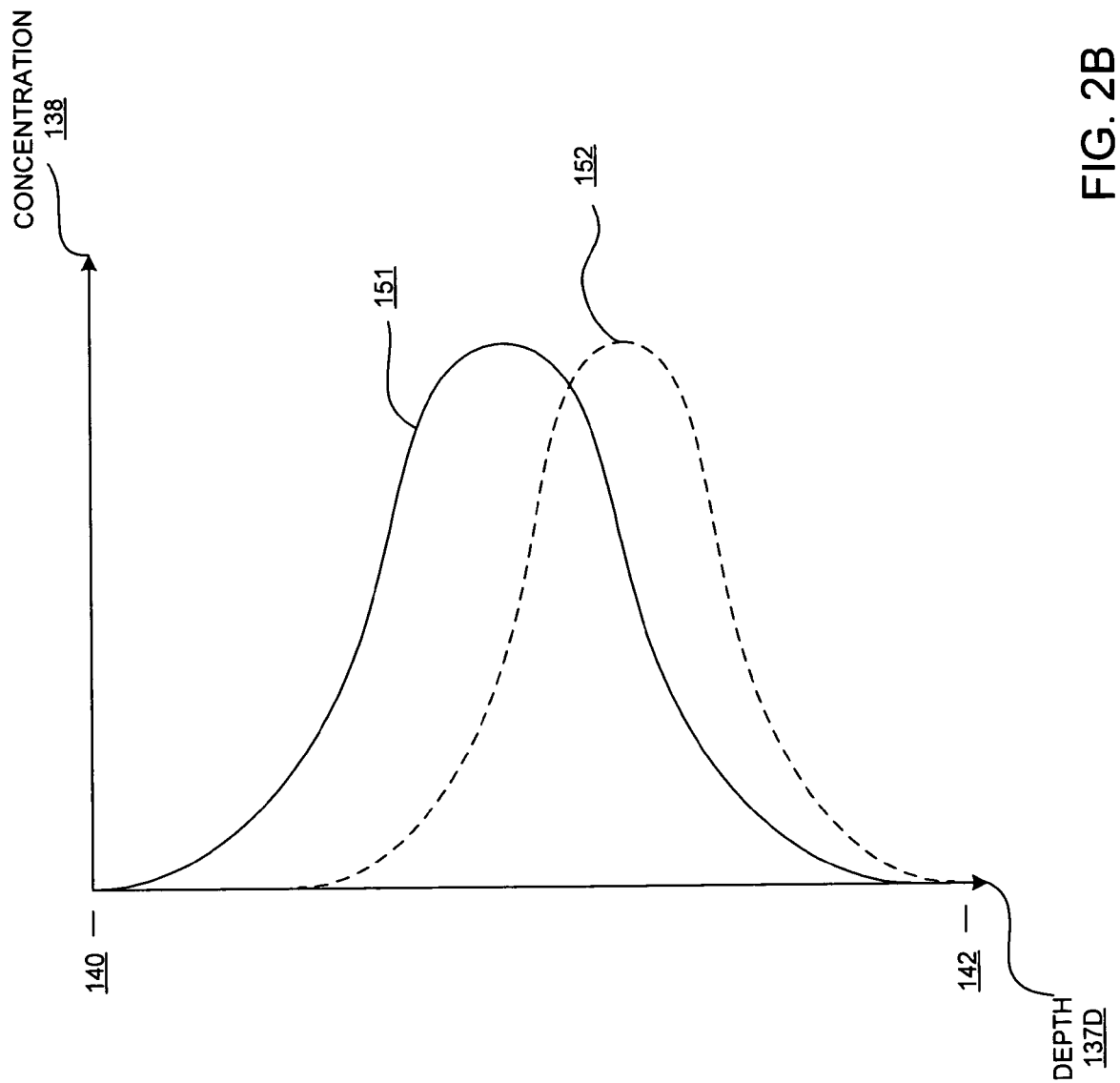
FIG. 2B is a graphical diagram depicting exemplary implant profiles for implants associated with FIG. 2A.

FIG. 2B is a graphical diagram depicting exemplary implant profiles for implants associated with FIG. 2A. Along depth of implant axis 137D, as associated with thickness 137 of silicon layer 141, locations of a top surface 140 and a bottom surface 142 are graphically indicated. Location of a peak concentration as indicated with dopant concentration axis 138 of implant profiles for implants 151 and 152 is within thickness 137 of silicon layer 141. Implant 151 provide a Gaussian distribution approximately centered to or just below the center of thickness of silicon layer 141 of FIG. 2A. The implantation profile of implant 152 is shown with a dashed line to delineate its profile from the profile of implant 151. As graphically indicated, though both implantation profiles generally have a Gaussian distribution, the implantation profile associated with implant 152 has its peak closer to bottom surface 142 than the implantation profile of implant 151.

Notably, it should be appreciated that doping is generally not uniform through the thickness of a silicon layer, but is more generally along the lines of a Gaussian distribution. Charge transport is generally most effective through the lightest doped regions. Accordingly, without the addition of an implant 152, there would be a light distribution of n-type ions in near proximity to top surface 140 and bottom surface 142 of silicon layer 141. At or near top surface 140 of silicon layer 141, a low n-type concentration provides means for facilitating charge transfer in this region for operation of memory array 100. With respect to the lighter distribution in near proximity to bottom surface 142 of silicon layer 141, however, such a lightly doped path would facilitate charge transfer of parasitic BJTs mentioned elsewhere herein. Accordingly, by adding implant 152, this concentration of n-type dopants in near proximity to bottom surface 142 is increased, which results in a reduction in charge transport along or near bottom surface 142 of silicon layer 141. Referring back to FIGS. 1A and 1B, it should be appreciated that each of parasitic BJTs 125, 126, 127, and 128 is effectively inhibited from parasitic charge transfer owing to the addition of implant 152.

Notably, though implant 152 may be added to have more n-type ions concentrated at or in near proximity to bottom surface 142 of silicon layer 141 for bitline region 106, implant 152 may be omitted, as implant 150 may be sufficient to inhibit charge transfer of parasitic BJTs 126 and 127.

Notably, at or near the mid-point of thickness 137 of silicon layer 141, n-type concentration is high owing to implant 151, and thus charge transfer is inhibited in this region. At or near top surface 140 of silicon layer 141, n-type concentration remains low owing to implant 151 being targeted more toward the middle thickness of silicon layer 141. As described above, such low concentration facilitates charge transfer in this region for operation of memory array 100.

For an approximately 80 to 100 nanometer ("nm"), thickness 137 of silicon layer 141, Table 1 below provides example materials, approximate dosages ranges, where for example 1-8 E15 means a range of approximately $1 \times 10^{15}$ to $8 \times 10^{15}$ at/cm$^2$, and approximate energy levels for implants for the embodiment described with reference to FIG. 2A.

TABLE 1

| Implant (by reference no.) | Material | Dosage (at/cm$^2$) | Energy (keV) |
|---|---|---|---|
| 151 | Arsenic (As) | 1–8E15 | 20–50 |
| 152 | Arsenic (As) | 0.8–8E14 | 35–70 |

Notably, dopants that diffuse more readily in silicon than arsenic, such as phosphorus or another dopant from the same column in the Periodic Table of Elements, may be used. Alternatively, or in addition to one or more of the embodiments described with respect to FIG. 2A, a silicon layer 141 thinning etch 153, as illustratively shown in FIG. 3A, may be used to reduce the effect of one or more of parasitic BJTs 125 through 128. Moreover, rather than having implant 151 followed by implant 152, a single implant 151 may be used. For an implementation of a single implant 151, arsenic may be implanted with a dosage range of approximately $1 \times 10^{15}$ to $8 \times 10^{15}$ at/cm$^2$ for an energy in a range of approximately 40 to 80 keV for targeting to approximately the bottom half of silicon layer 141.

Figure 3A:
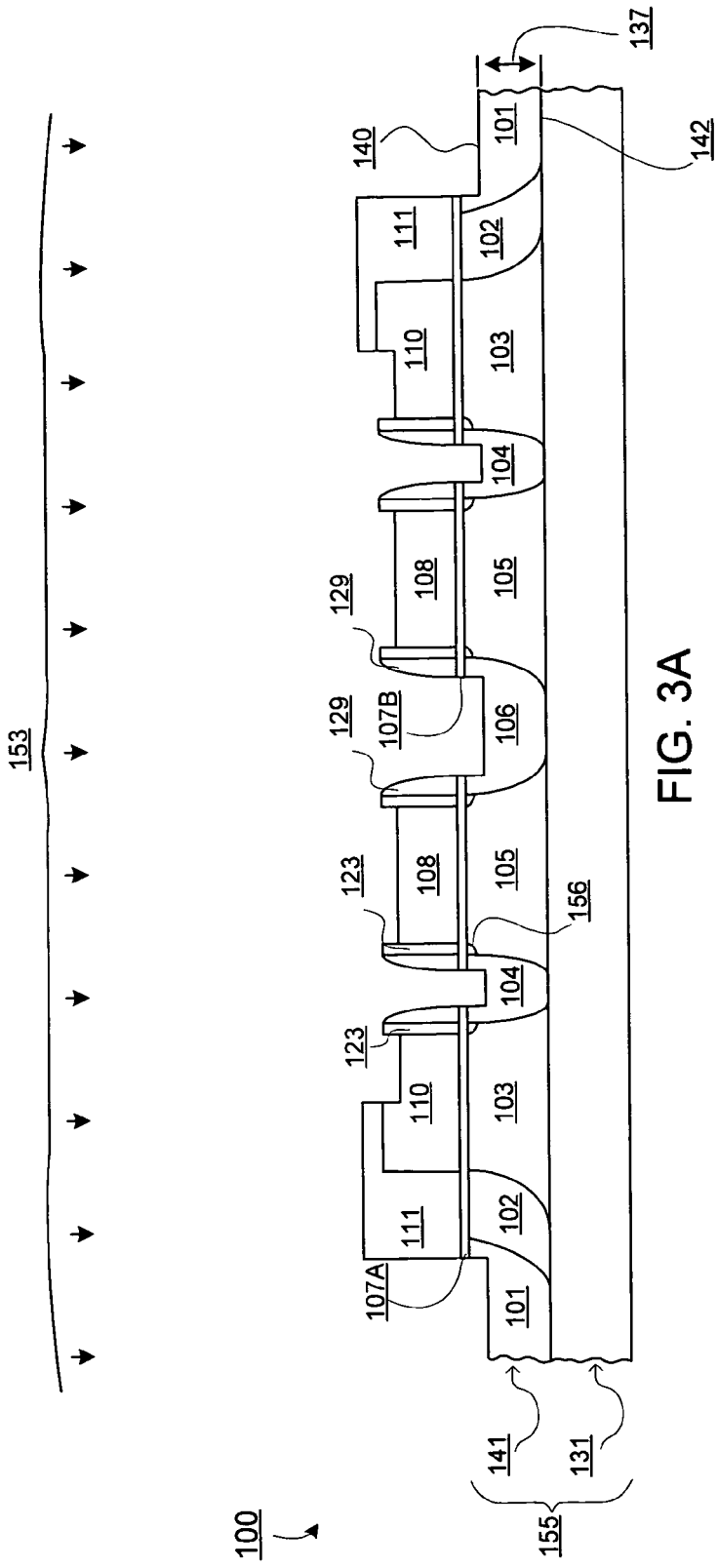
FIG. 3A is a cross-sectional view depicting an exemplary embodiment of a silicon layer thinning etch of a memory array.

FIG. 3A is a cross-sectional view depicting an exemplary embodiment of a silicon layer 141 thinning etch 153 of memory array 100. A known anisotropic dry or wet etch of silicon, or oxidation and wet etching, may be used for etch 153. Etch 153 may be used to thin only bitline region 106, or it may be used to thin regions 101, 104, and 106 as illustratively shown in FIG. 3A. Notably, thinning etch 153 may etch, though slightly, spacers 111, 123, and 129, but will more readily etch polysilicon gates 108 and 110 and exposed regions of silicon layer 141, namely anode regions 101, cathodes 104, and bitline region 106. Regions 101, 104, and 106, as well as gates 108 and 110, may be thinned responsive to silicon etch 153 for this example.

Figure 3B:
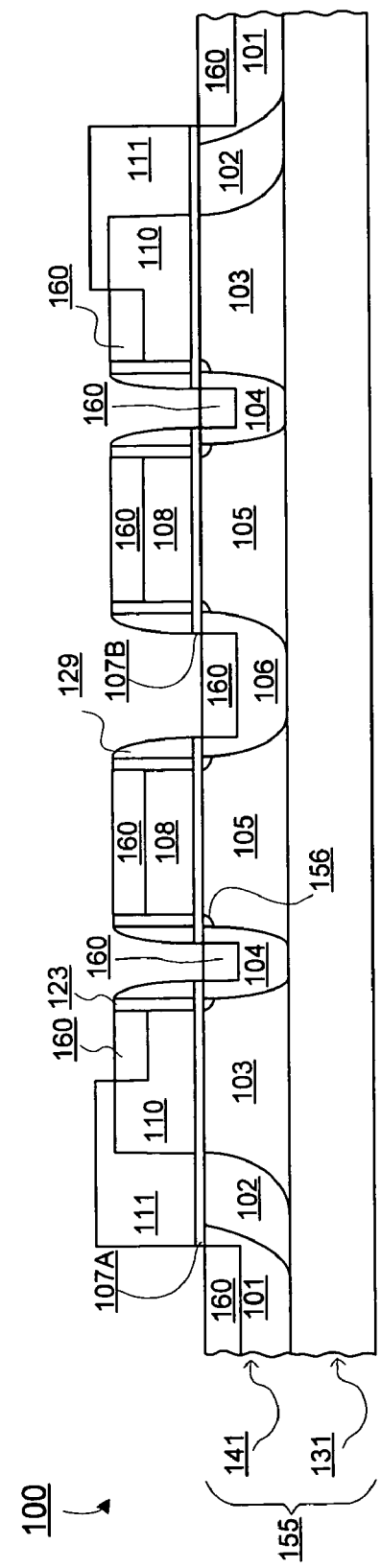
FIG. 3B is a cross-sectional view depicting the exemplary embodiment of FIG. 3A with silicide regions.

Subsequent silicidation of regions 101, 104, and 106 as well as polysilicon gates 108 and 110 may be used to restore height removed via thinning etch 153, as generally indicated in FIG. 3B. FIG. 3B is a cross-sectional view depicting memory array 100 of FIG. 3A with silicide regions 160. Silicide regions 160 may be conventionally formed salicides ("salicide regions") responsive to annealing deposited metal on exposed portions of regions 101, 104, and 106, as well as gates 108 and 110.

By thinning silicon layer 141 in regions 101, 104, and 106, recombination of charge flowing near salicide regions 160 associated with regions 101, 104, and 106 is impacted. Thus, locally thinned and partially salicided regions 101, 104, and 106 facilitate minority carrier movement, namely of holes in n-type regions 104 and 106 and of electrons in p-type regions 101 in this example, to be proximate to salicides. In other words, the region between bottom surface 142 and the bottom of salicide regions 160 is narrowed by locally thinning silicon layer 141 in regions 101, 104, and 106. Because minority carriers in these locally thinned regions are transported closer to salicide regions 160, charge recombination is more likely, which means charge injection facilitated by parasitic BJTs 125 through 128 described elsewhere herein is reduced. For a silicon layer 141 of approximately 100 nm, silicon layer 141 may be thinned down to approximately 50 to 80 nm for subsequent silicidation.

Figure 4A:
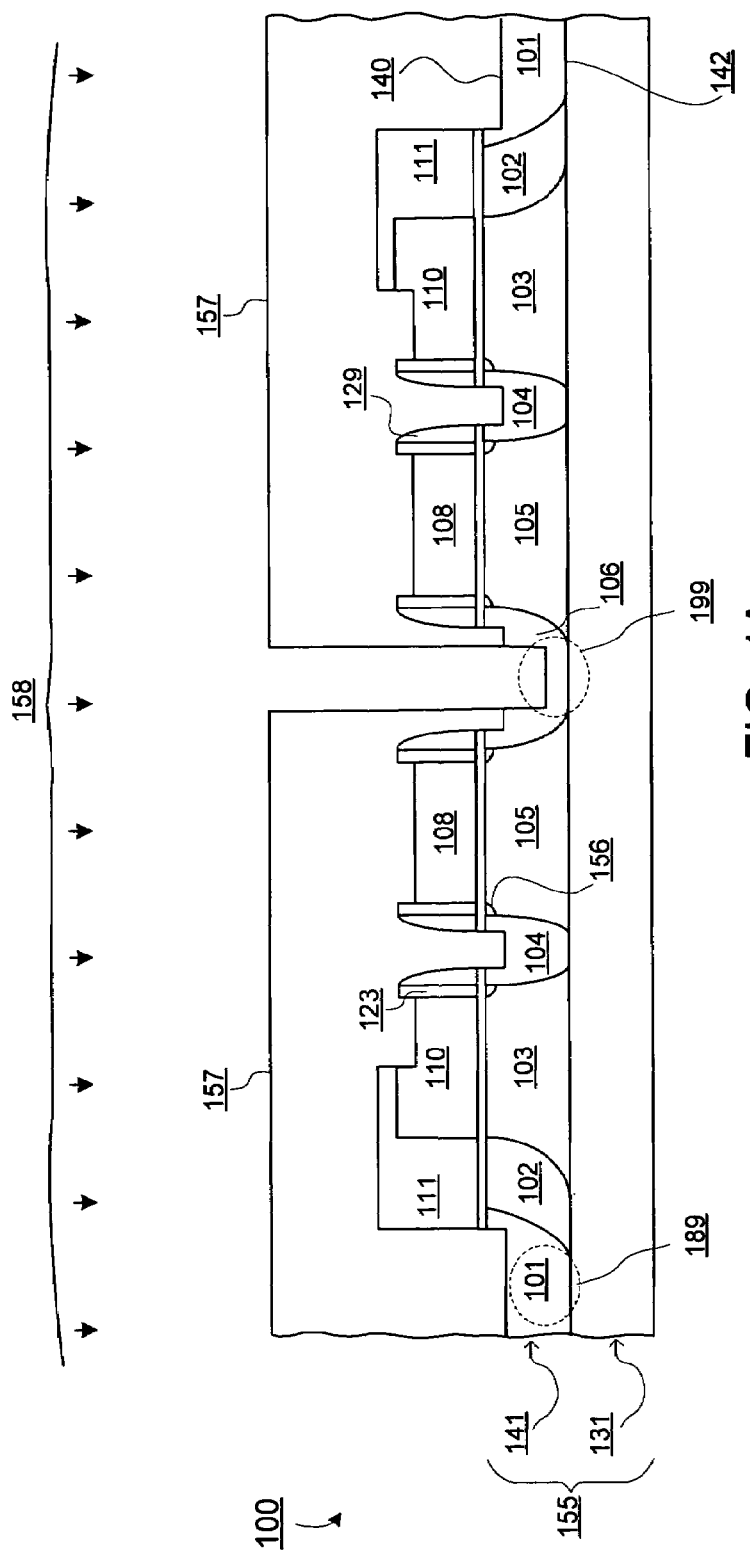
FIG. 4A is a cross-sectional view depicting an alternative exemplary embodiment of a silicon layer thinning patterned etch of a memory array.
Figure 4B:
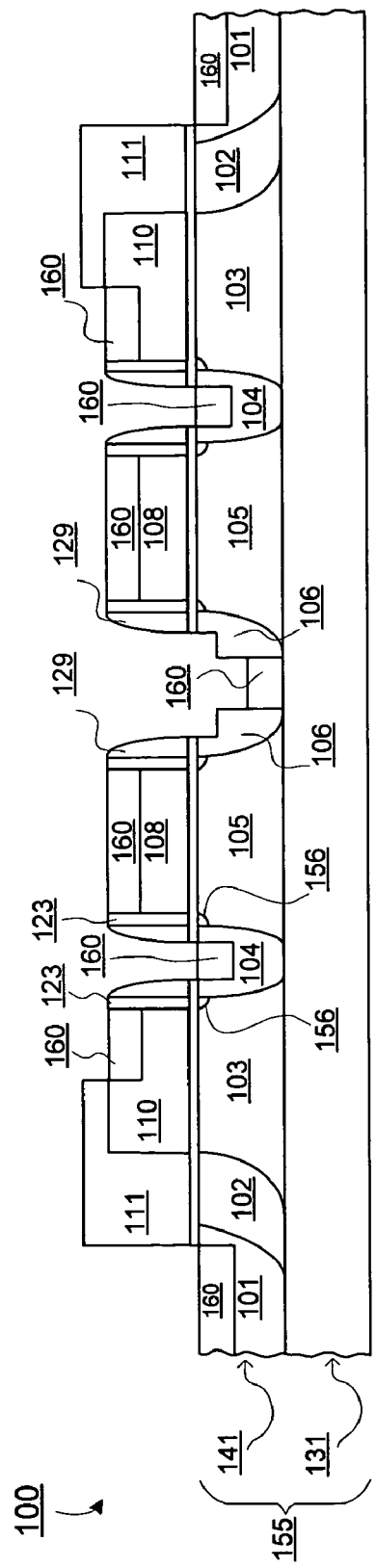
FIG. 4B is a cross-sectional view depicting the exemplary embodiment of FIG. 4A with salicide regions.

FIGS. 4A and 4B are cross-sectional views depicting an alternative embodiment of the embodiment illustratively shown with reference to FIGS. 3A and 3B. In FIG. 4A, after local thinning of silicon layer 141 in regions 101, 104, and 106, as illustratively shown in FIG. 3A, a mask 157 is formed over memory array 100. Mask 157 leaves exposed locally thinned bitline region 106 and covers, among other things, regions 101 and 104, as well as gates 108 and 110. Mask 157 is for a patterned etch 158 of bitline region 106. A known dry or wet etch, which is generally an anisotropic etch, may be used for etch 158. Etch 158 is for further local thinning of bitline region 106. Thus, for example, portion 199, as generally indicated by a dashed circle, of bitline region 106 has a thinner profile than portion 189, also generally indicated by a dashed circle, of anode region 101.

FIG. 4B is the cross-sectional view of FIG. 4A after forming salicide regions 160. Notably, because regions 160 may be formed as self-aligned silicides, they may be referred to as salicide regions 160. Because a salicide region 160 formed from silicon of bitline region 106 extends to BOx layer 131, charge flowing through bitline region 106 is more likely to be recombined. In other words, minority carriers, the flow of which is facilitated by parasitic BJTs 126 and 127 of FIG. 1B, pass through salicide region 160 of bitline region 106 in this embodiment. For a silicon layer 141 of approximately 100 nm, silicon layer 141 may be thinned down to approximately 25 to 60 nm for subsequent silicidation of bitline region 106. Notably, only one bitline region 106 and one corresponding salicide region 160 formed therein are illustratively shown in FIG. 4B, as only a portion of memory array 100 is shown for purposes of clarity. However, memory array 100 should be understood to include multiple bitline regions and multiple salicide regions 160 formed therein in this embodiment.

Figure 5:
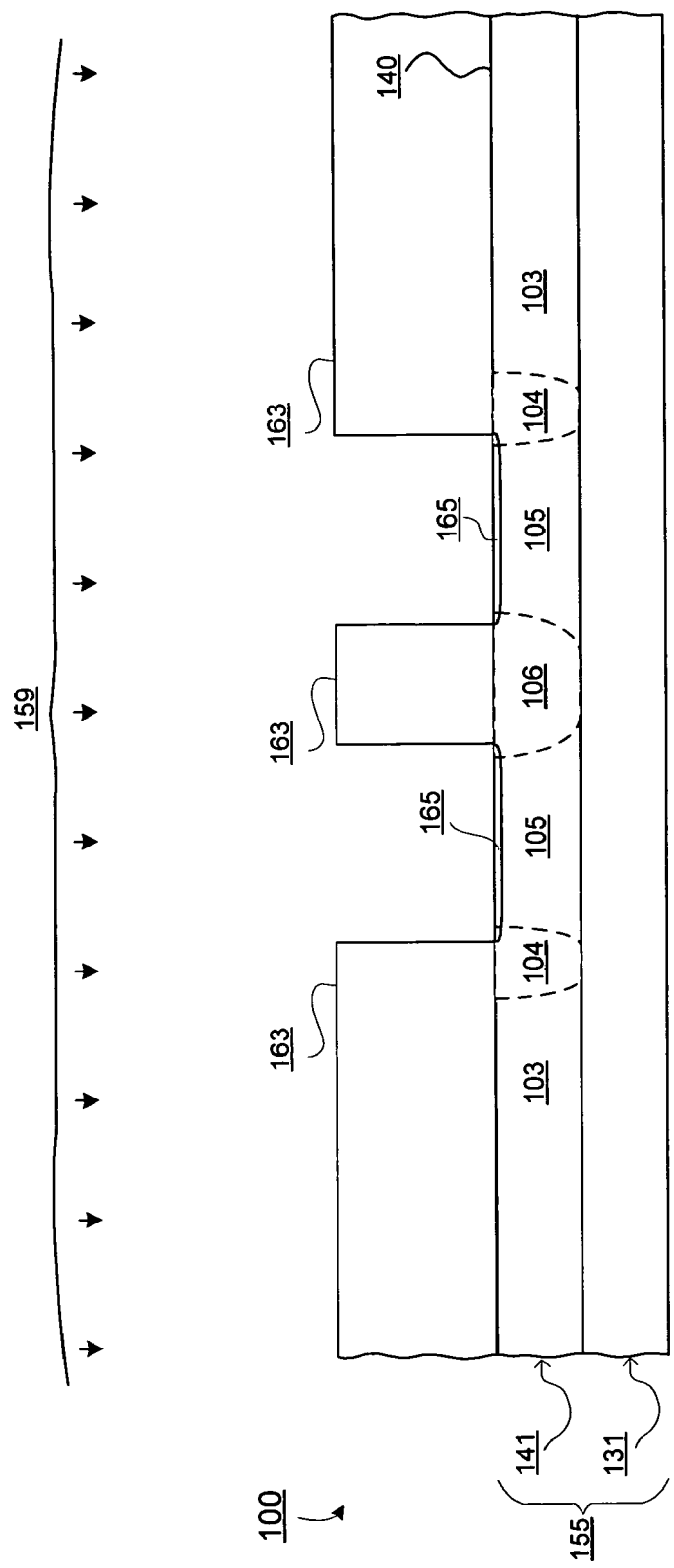
FIG. 5 is a cross-sectional view depicting an exemplary embodiment of a threshold voltage (Vt) adjustment implant of a memory array for forming shallow implant regions.

FIG. 5 is a cross-sectional view depicting an exemplary embodiment of a threshold voltage (Vt) adjustment implant 159 of memory array 100 for forming shallow implant regions 165. More particularly, a Vt-adjust implant mask 163 is formed to cover region 103 and to cover substantial portions of 104 and 106. Notably, regions 101, 102, 104 and 106, which are formed in silicon layer 141, have not yet been formed at this point in time. However, to indicate a relationship between location of implant mask 163 and regions 104 and 106, approximate locations of regions 104 and 106 are indicated in dashed-lines. Notably, by substantially masking regions 104 and 106, counter-doping from implant 159, such as an implant of boron, is significantly reduced with respect to bitline region 106 and cathodes 104. For example, implant 159 may be boron implanted into approximately 100 nm thick silicon with a dosage in a range of approximately 5E11 to 1E14 at/$cm^2$ with implant energy of less than approximately 40 keV.

Figure 6:
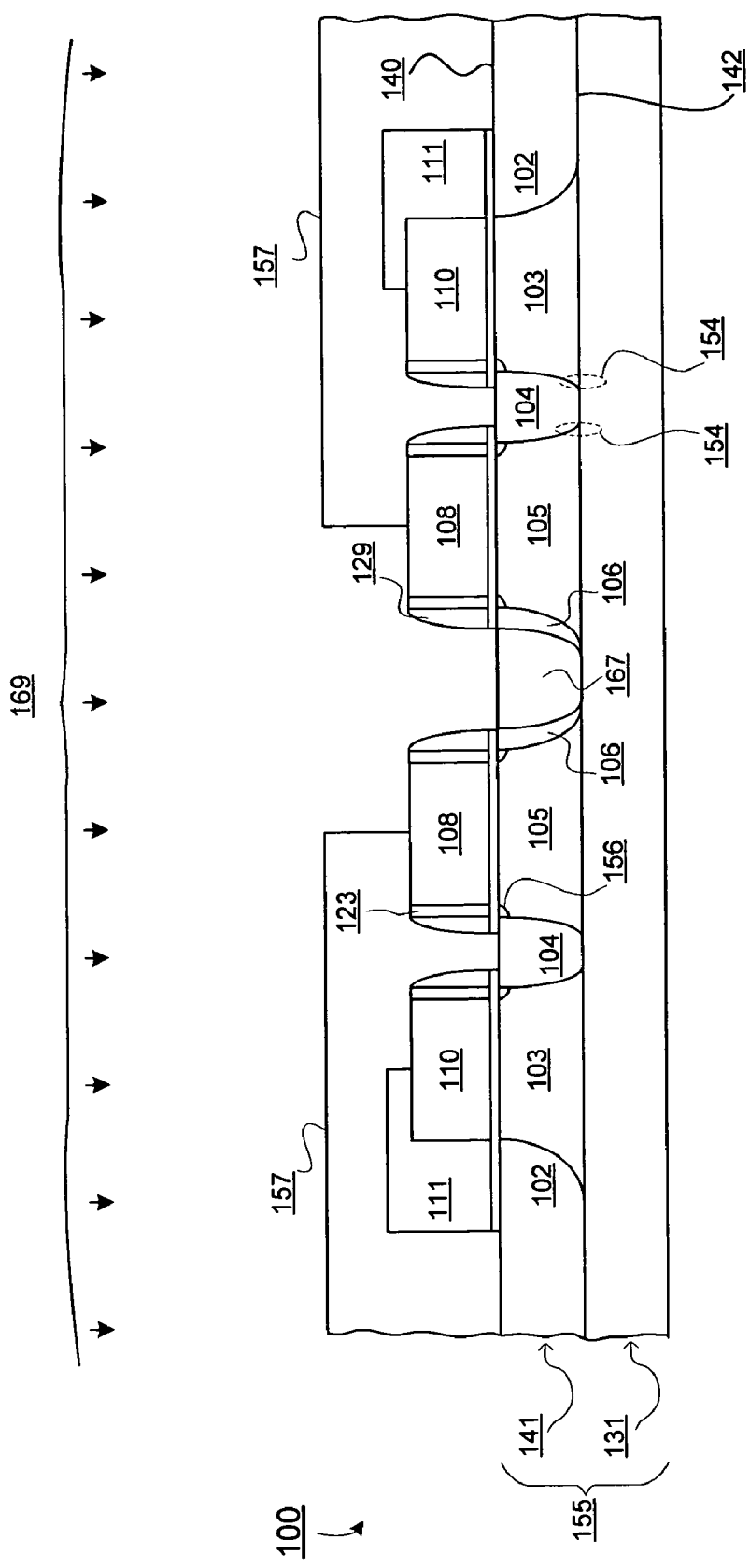
FIG. 6 is a cross-sectional view depicting an exemplary embodiment of a memory array with a heavy ion implant.

FIG. 6 is a cross-sectional view depicting an exemplary embodiment of memory array 100 with a heavy ion implant 169. Heavy ion implant 169 is to create a damaged region 167 in silicon layer 141. Damaged region 167, which is formed dividing bitline contact region 106, is exposed and other portions of memory array 100 are protected by mask 157. Notably, edges of mask 157 may be located above gates 108 for lateral control of the profile of damage region 167 versus the lateral profile of the junction between regions 105 and 106. Additionally, opening up mask 157 edges to be above gates 108 may provide additional control for forming damage or recombination region 167. Accordingly, each bitline region 106 may have a damaged region 167. Damaged region 167 may be formed before or after a source/drain anneal, but is formed before silicidation of bitline region 106. While not wishing to be bound by theory, it is believed that damaged region 167 creates electron trap levels.

Notably, implant 169 may be perpendicular to top surface 140 of silicon layer 141 or may be done at another angle with respect to top surface 140 up to approximately a 45 degree angle. By creating damaged region 167, the likelihood of a conductive path, such as from p-well 105 of one memory cell to a p-well 105 of an adjacent memory cell is substantially reduced, and thus the effect of parasitic BJT 127 of FIG. 1B is substantially reduced. Heavy ion implant 169 may be done with any of a variety of known heavy ions having a mass greater than or equal to the atomic mass of silicon, or of at least approximately 28 atomic mass units, such as heavy ions from column IVa or VIIIa of the Periodic Table of the Elements, or a cluster or compound of such ions, including xenon or germanium.

Figure 7A:
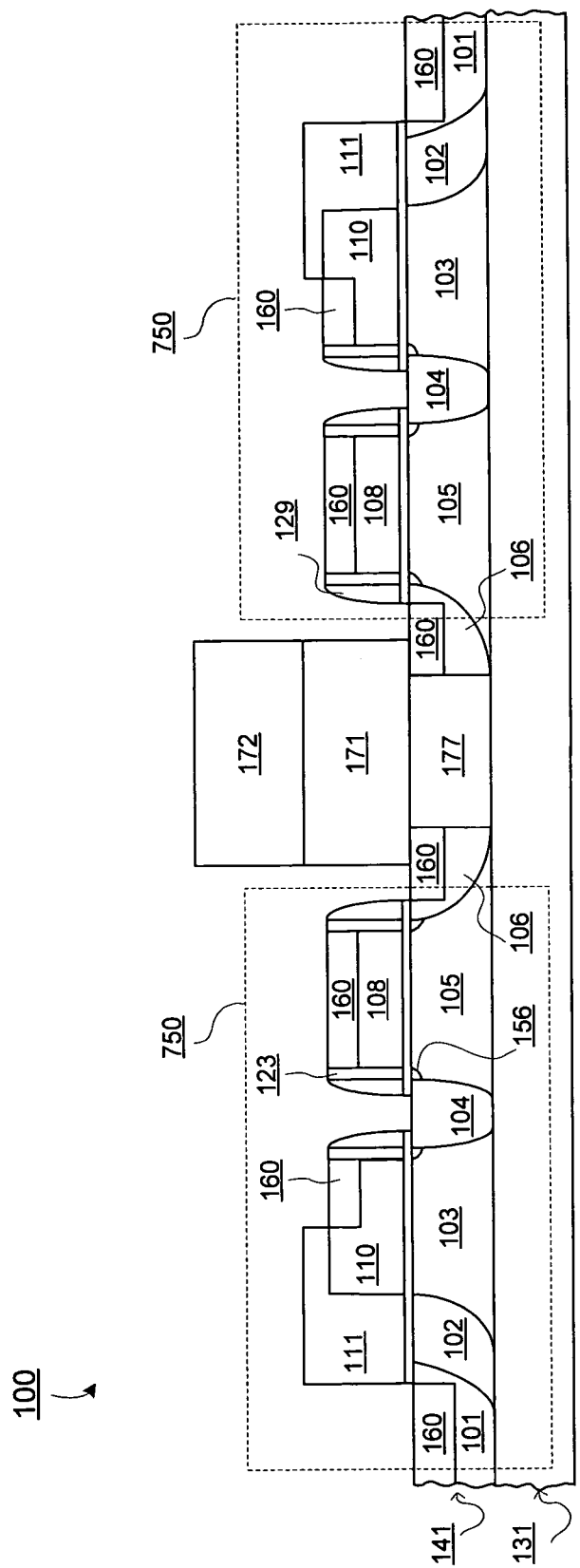
FIG. 7A is cross-sectional view depicting an exemplary embodiment of a memory array having a shallow trench isolation ("STI") region in a bitline region.

Alternatively to the embodiment of FIG. 6, an isolation region 177 may be formed as illustratively shown in FIG. 7A. FIG. 7A is cross-sectional view depicting an exemplary embodiment of memory array 100 having shallow trench isolation ("STI") region 177. STI region 177 effectively divides bitline region 106. However, in this embodiment, separate bitline regions 106 are formed for each shared bitline contact 171 of bitline adjacent thyristor-based memory cells 750. Thus, each bitline region 106 is formed after the formation of an associated STI region 177. Bitline contact 171 may be a defined shape to facilitate contact lithography. For example, bitline contact 171 may be formed using a rectangularly shaped contact to effectively provide a rectangularly shaped plug. Contact formation uniformity may be facilitated. Accordingly, there may be one such bitline contact 171 for each pair of memory cells.

In order to share a metal line 172 for providing a bitline to adjacent memory cells, a bitline contact 171 may be formed partially over salicide regions 160 of each bitline region 106 of bitline-adjacent memory cells 750. In this configuration, adjacent memory cells may share a bitline metal line 172. Contact 171 may be formed of a metal, and STI region 177 may be conventionally formed. Notably, by creating an STI or other isolation region 177, charge transport through the base of parasitic BJT 127 of FIG. 1B may be eliminated. Moreover, parasitic BJT 127 of FIG. 1B may be eliminated.

Figure 7B:
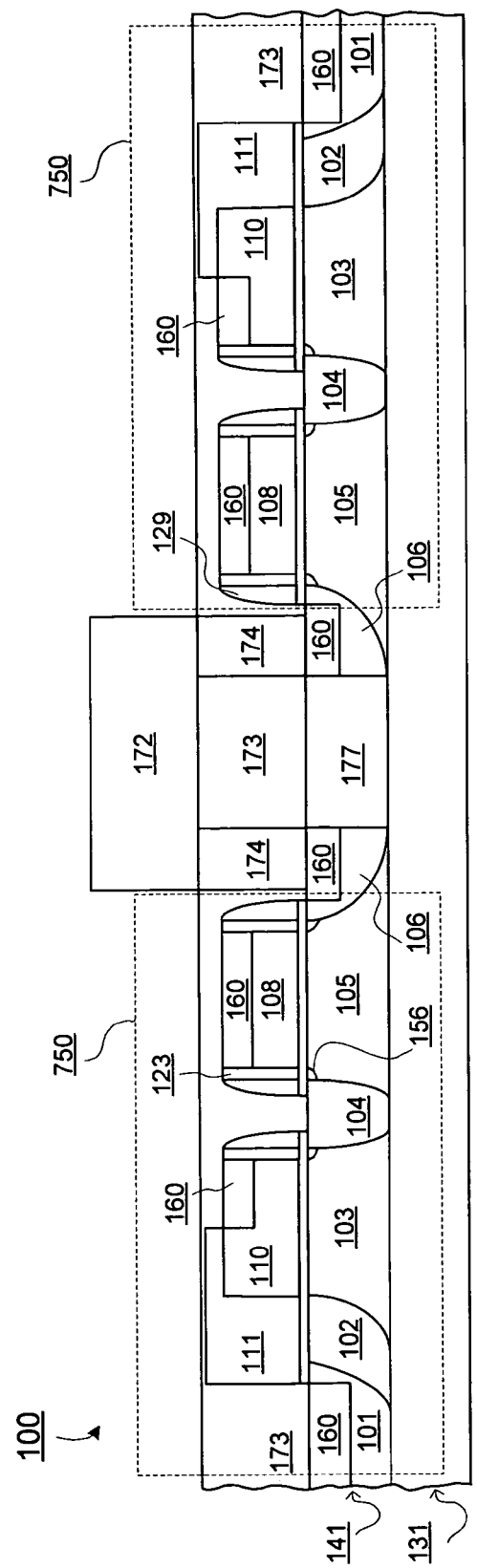
FIG. 7B is a cross-sectional view depicting an exemplary embodiment of a memory array with a pair of bitline contacts on either side of an STI region.

Alternatively to a local interconnect bitline contact 171, a pair of bitline contacts 174 may be implemented as illustratively shown in FIG. 7B. FIG. 7B is a cross-sectional view depicting an exemplary embodiment of memory array 100 with bitline contacts 174 on either side of an STI region 177. Respective bitline contacts 174 are formed for individual coupling to salicide regions 160 of each bitline region 106.

Thus, each bitline region 106 separated by an STI region 177 may have respective salicide regions 160 to which respective contacts 174 may be coupled. An inter-layer dielectric 173 may be deposited, including between contacts 174, in a conventional manner. Metal line 172 may be formed to be in contact with contacts 174, in effect forming a bridge over STI region 177. Though not shown to scale, it should be appreciated that a smaller STI region 177 may be used by having separate contacts 174 as opposed to one local interconnect bitline contact 171 for each pair of bitline-adjacent memory cells 750 as illustratively shown in FIG. 7A.

Figure 7C:
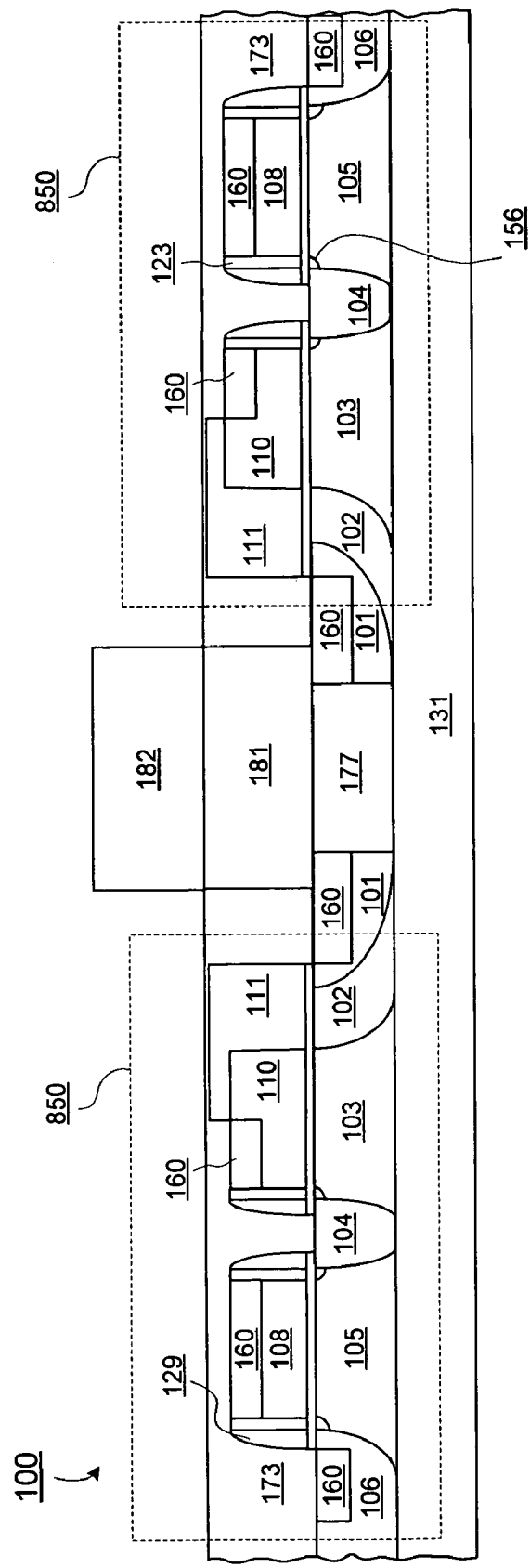
FIG. 7C is cross-sectional view depicting an exemplary embodiment of a memory array with separate anode regions on either side of an STI region.
Figure 7D:
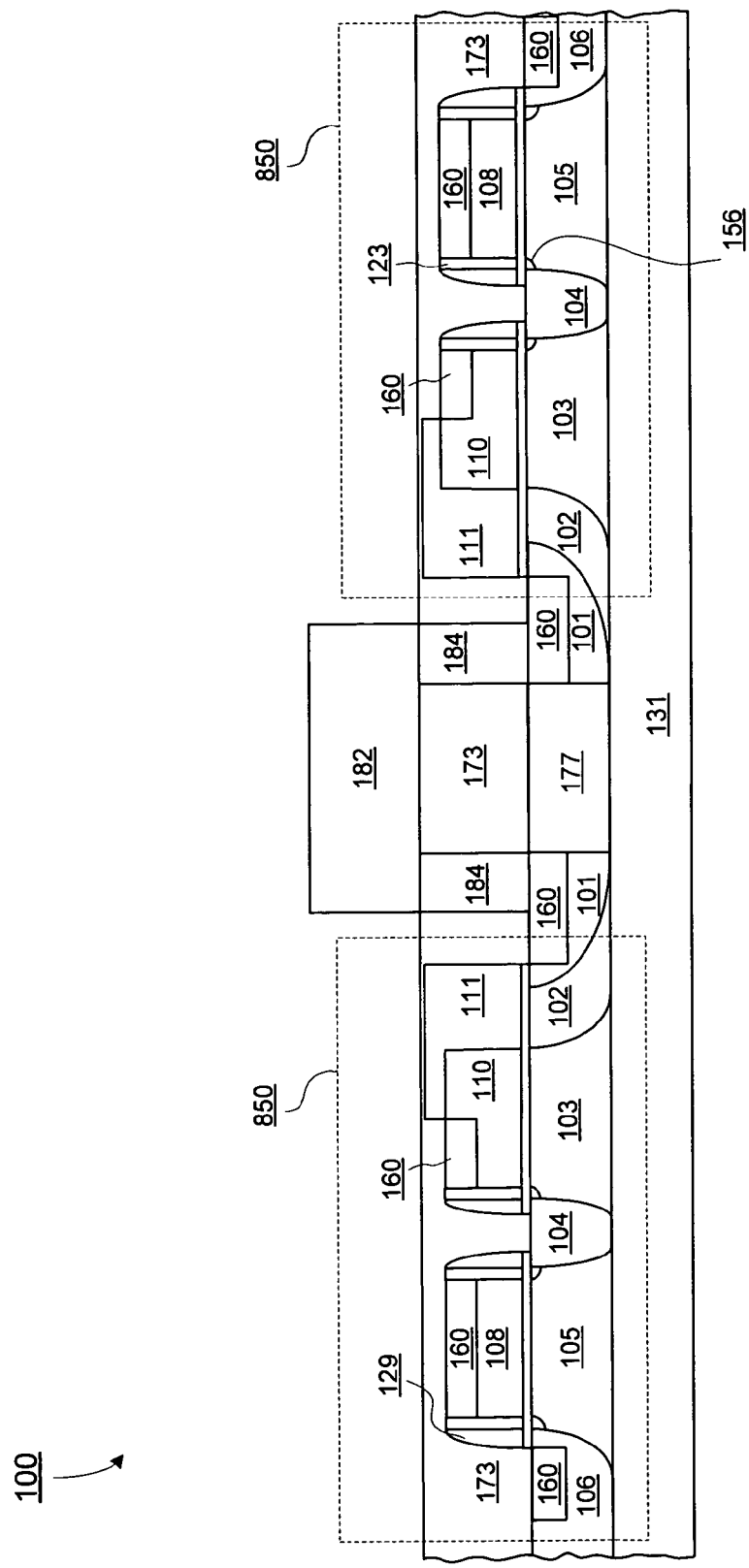
FIG. 7D is a cross-sectional view depicting an exemplary embodiment of a memory array with a pair of anode contacts on either side of an STI region.

Though contacts 171 and 174 of FIGS. 7A and 7B have been described in terms of bitline contacts, it should be understood that such contacts may be used as anode contacts, as respectively illustratively shown in the cross-sectional views of FIGS. 7C and 7D, or as storage node contacts, as illustratively shown in the cross-sectional views of FIGS. 7E and 7F.

FIG. 7C is cross-sectional view depicting an exemplary embodiment of memory array 100 with separate anode regions 101 on either side of an STI region 177. STI region 177 effectively divides an anode region 101. However, in this embodiment, separate anode regions 101 are formed for each shared anode contact 181 of anode-adjacent thyristor-based memory cells 850. Thus, each anode region 101 is formed after the formation of an associated STI region 177. Bitline contact 171 may be a defined shape to facilitate contact lithography. For example, bitline contact 171 may be formed using a rectangularly shaped contact to effectively provide a rectangularly shaped plug. Contact formation uniformity may be facilitated. Accordingly, there may be one such bitline contact 171 for each pair of memory cells.

In order to share a metal line 182 for providing a reference voltage to anode-adjacent memory cells, an anode contact 181 may be formed over salicide regions 160 of each anode region 101 of anode-adjacent memory cells 850. In this configuration, adjacent memory cells may share an anode metal line 182. Contact 181 may be formed of a metal, and STI region 177 may be conventionally formed. Notably, by creating an STI or other isolation region 177, charge transport through the base of parasitic BJT 125 of FIG. 1A may be eliminated. Moreover, parasitic BJT 125 of FIG. 1A may be eliminated.

Alternatively to a local interconnect anode contact 181, a pair of anode contacts 184 may be implemented as illustratively shown in FIG. 7D. FIG. 7D is a cross-sectional view depicting an exemplary embodiment of memory array 100 with anode contacts 184 on either side of an STI region 177. Respective anode contacts 184 are formed for individual coupling to salicide regions 160 of each anode region 101. Thus, each anode region 101 separated by an STI region 177 may have respective salicide regions 160 to which respective contacts 184 may be coupled. An inter-layer dielectric 173 may be deposited, including between contacts 184, in a conventional manner. Metal line 182 may be formed to be in contact with contacts 184, in effect forming a bridge over STI region 177. A smaller STI region 177 may be used by having separate contacts 184 as opposed to one local interconnect anode contact 181 for each pair of anode-adjacent memory cells 850 as illustratively shown in FIG. 7C.

FIG. 7E is cross-sectional view depicting an exemplary embodiment of a thyristor-based memory cell 950 with separate cathodes 104 on either side of an STI region 177. STI region 177 effectively divides a cathode 104. However, in this embodiment, separate cathodes 104 are formed for each shared storage node contact 191 of a memory cell 950 for coupling an access transistor 952 to a thyristor-based storage element 951. Thus, each cathode 104 is formed after the formation of an associated STI region 177. Notably, cathode 104 of access transistor 952 may be considered a source/drain region, and cathode 104 of thyristor-based storage element 951 may be considered a cathode region.

Storage node contact 191 may be formed partially over salicide regions 160 of each cathode 104. Contact 191 may be formed of a metal, and STI region 177 may be conventionally formed. Notably, by creating an STI or other isolation region 177, charge transport through the base of parasitic BJT 128 of FIG. 1A may be eliminated. Moreover, parasitic BJT 128 of FIG. 1A may be eliminated.

Alternatively to a local interconnect storage node contact 191, a pair of storage node contacts 194 may be implemented as illustratively shown in FIG. 7F. FIG. 7F is a cross-sectional view depicting an exemplary embodiment of memory cell 950 with storage node contacts 194 on either side of an STI region 177. Respective storage node contacts 194 are formed for individual coupling to salicide regions 160 of each cathode 104. Thus, each cathode 104 separated by an STI region 177 may have respective salicide regions 160 to which respective contacts 194 may be coupled. An inter-layer dielectric 173 may be deposited, including between contacts 194, in a conventional manner. A storage node line 192 may be coupled to storage node contacts 194 for electrical continuity therebetween. A smaller STI region 177 may be used by having separate contacts 194 as opposed to one local interconnect storage node contact 191 as illustratively shown in FIG. 7E.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit having memory, comprising:
    thyristor-based memory cells, each of the thyristor-based memory cells including a thyristor-based storage element and an access transistor, the thyristor-based storage element including an anode region and a cathode region;
    a pair of the thyristor-based memory cells commonly coupled via a bitline region associated with the access transistor;
    the pair of the thyristor-based memory cells defining a parasitic bipolar junction transistor therebetween responsive to the bitline region being common;
    the bitline region having a locally implant-damaged region to inhibit charge transfer between the pair of the thyristor-based memory cells via the parasitic bipolar junction transistor;
    the locally implant-damaged region extending to and in contact with an insulator layer of a silicon-on-insulator wafer on which the integrated circuit is formed; and
    the locally implant-damaged region formed with lateral control for at least some separation from p-n junctions of the bitline region.

2. The integrated circuit according to claim 1, wherein the bitline region includes a portion on each side of the locally implant-damaged region to provide a source/drain region for the access transistor of each thyristor-based memory cell of the pair.

3. The integrated circuit according to claim 2, wherein the locally implant-damaged region is formed using an implant angle in a range of approximately perpendicular to 45 degrees from a top surface of the silicon-on-insulator wafer.

4. The integrated circuit according to claim 1, wherein the locally implant-damaged region is formed by implanting heavy ions having an atomic mass of at least 28 atomic mass units.

5. The integrated circuit according to claim 4, wherein the heavy ions are part of a cluster or compound.

* * * * *